US012749550B2

(12) United States Patent
Jeong

(10) Patent No.: US 12,749,550 B2
(45) Date of Patent: Sep. 29, 2026

(54) IMAGE DISPLAY DEVICE

(71) Applicant: LG ELECTRONICS INC., Seoul (KR)

(72) Inventor: Wonsang Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 69 days.

(21) Appl. No.: 18/815,077

(22) Filed: Aug. 26, 2024

(65) Prior Publication Data

US 2025/0078944 A1 Mar. 6, 2025

(30) Foreign Application Priority Data

Sep. 1, 2023 (KR) ........................ 10-2023-0116345

(51) Int. Cl.

*G11C 29/10* (2006.01)
*G11C 29/12* (2006.01)
*G11C 29/04* (2006.01)

(52) U.S. Cl.

CPC ........ *G11C 29/10* (2013.01); *G11C 29/12015* (2013.01); *G11C 2029/0407* (2013.01)

(58) Field of Classification Search

CPC .............. G11C 29/10; G11C 29/12015; G11C 2029/0407; G09G 5/003; G09G 5/39; G09G 2320/0693; G09G 2330/027; G09G 2330/12

See application file for complete search history.

(56) References Cited

U.S. PATENT DOCUMENTS

| | | | | |
|---|---|---|---|---|
| 6,275,221 B1 * | 8/2001 | Song | G09G 5/003 | 345/212 |
| 6,401,213 B1 * | 6/2002 | Jeddeloh | G11C 7/222 | 713/401 |
| 7,443,741 B2 * | 10/2008 | Butt | G11C 7/22 | 365/201 |
| 8,970,276 B1 * | 3/2015 | McShea | H03K 5/135 | 327/263 |
| 9,626,888 B2 * | 4/2017 | Wang | G09G 3/006 | |

(Continued)

FOREIGN PATENT DOCUMENTS

| | | |
|---|---|---|
| JP | 2012-194686 | 10/2012 |
| JP | 2012194686 A * | 10/2012 |

(Continued)

OTHER PUBLICATIONS

1 European Patent Office Application Serial No. 24197142.3, Search Report dated Jan. 20, 2025, 9 pages.

*Primary Examiner* — Steve N Nguyen
(74) *Attorney, Agent, or Firm* — LEE, HONG, DEGERMAN, KANG & WAIMEY

(57) ABSTRACT

An image display device is disclosed. The image display device includes a memory controller configured to output a first signal and a toggling second signal, a first memory configured to process the first signal based on the second signal, and a second memory, wherein the memory controller performs a Shmoo test on the second signal based on the image display device being turned off, stores data on results of performing the Shmoo test in the second memory, and outputs the second signal based on data stored in the second memory based on the image display device being turned on.

9 Claims, 6 Drawing Sheets

(56) References Cited

U.S. PATENT DOCUMENTS

| | | | | |
|---|---|---|---|---|
| 2005/0105349 | A1* | 5/2005 | Dahlberg | G11C 7/1078<br>365/201 |
| 2007/0257693 | A1* | 11/2007 | Stott | G11C 29/022<br>324/762.02 |
| 2022/0188019 | A1* | 6/2022 | Jayaraman | G06F 13/1689 |
| 2022/0366995 | A1* | 11/2022 | Lu | G11C 29/14 |
| 2023/0386600 | A1* | 11/2023 | Lee | G11C 29/52 |

FOREIGN PATENT DOCUMENTS

| | | |
|---|---|---|
| KR | 10-2019-0095834 | 8/2019 |
| KR | 10-2020-0084200 | 7/2020 |
| KR | 10-2023-0048904 | 4/2023 |

* cited by examiner

IMAGE DISPLAY DEVICE

CROSS-REFERENCE TO RELATED APPLICATION

Pursuant to 35 U.S.C. § 119(a), this application claims the benefit of earlier filing date and right of priority to Korean Patent Application No. 10-2023-0116345, filed on Sep. 1, 2023, the contents of which are hereby incorporated by reference herein in its entirety.

BACKGROUND OF THE INVENTION

Field of the Invention

The present disclosure relates to an image display device.

Description of the Related Art

Image display devices have a function of displaying images that users can view. For example, image display devices may include TVs, monitors, laptop computers, etc. equipped with a liquid crystal display (LCD) using liquid crystals or an OLED display using an organic light emitting diode (OLED).

Electronic devices including an image display device include a semiconductor memory such as double data rate synchronous DRAM (DDR SDRAM). Electronic devices store data in semiconductor memories and use the data stored in the semiconductor memories. Additionally, semiconductor memories use a data strobe signal to accurately recognize input data.

Generally, in order to accurately process a data signal, semiconductor memories require calibration to position a rising edge or a falling edge of a data strobe signal at the center of the window of the data signal, which is performed during the product production process. Additionally, by setting an electronic device based on the result of calibration of a data strobe signal, the accuracy of the operation of a semiconductor memory is secured. However, it is realistically impossible to perform calibration for all semiconductor memories, and the characteristics of semiconductor memories may vary due to differences in the environment in which the electronic device is used, such as external temperature or errors in the process. As a result, despite setting the electronic device based on the result of calibration of the data strobe signal, it is difficult to secure a timing margin.

SUMMARY OF THE INVENTION

An object of the present disclosure is to solve the above-described problems and other problems.

Another object of the present disclosure is to provide an image display device capable of securing a timing margin while minimizing deterioration of usability.

In accordance with the present disclosure, the above and other objects can be accomplished by the provision of an image display device including a memory controller configured to output a first signal and a toggling second signal, a first memory configured to process the first signal based on the second signal, and a second memory, wherein the memory controller performs a Shmoo test on the second signal based on the image display device being turned off, stores data on results of performing the Shmoo test in the second memory, and outputs the second signal based on data stored in the second memory based on the image display device being turned on.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
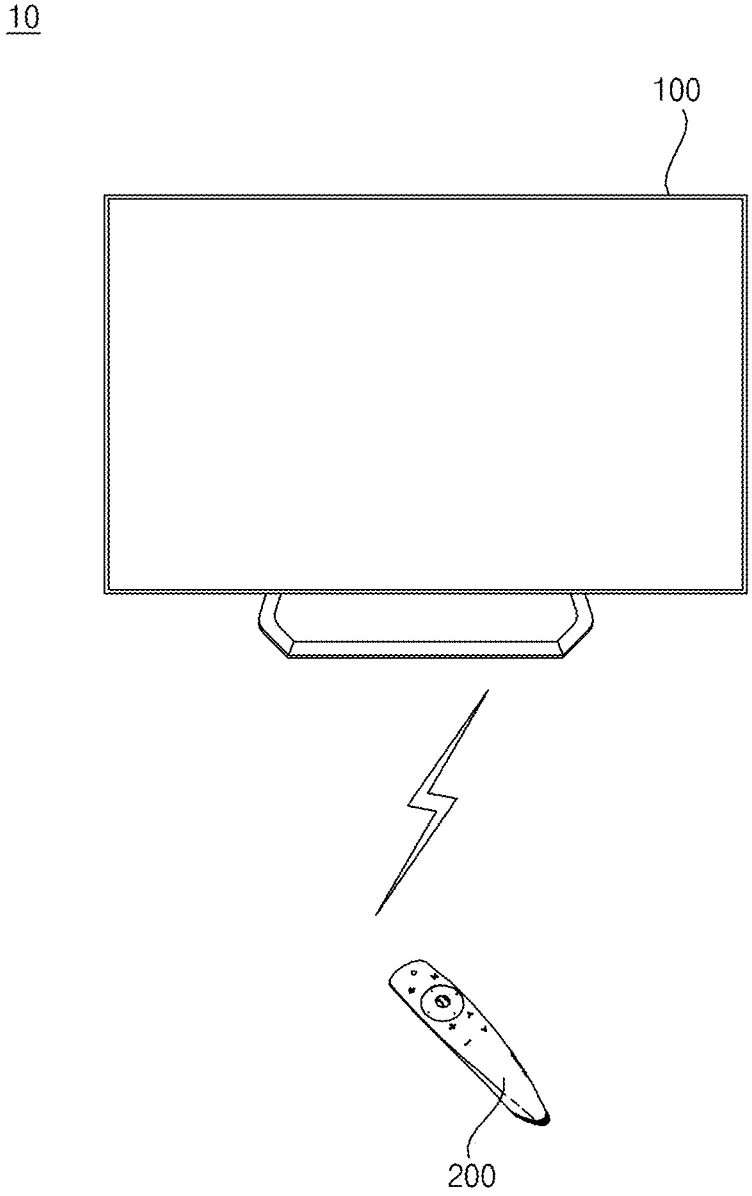
FIG. 1 is a diagram illustrating an image display system according to an embodiment of the present disclosure.

Hereinafter, the present disclosure will be described in detail with reference to the attached drawings. In the drawings, parts not related to description are omitted in order to clearly and briefly describe the present disclosure, and identical or extremely similar parts are denoted by the same reference numerals throughout the specification.

The suffixes "module" and "part" for components used in the following description are simply given in consideration of the ease of writing this specification and do not have any particularly important meaning or role. Accordingly, the terms "module" and "part" may be used interchangeably.

In the present disclosure, it will be further understood that the term "comprise" or "include" specifies the presence of a stated feature, figure, step, operation, component, part or combination thereof, but does not preclude the presence or addition of one or more other features, figures, steps, operations, components, or combinations thereof.

Further, in this specification, the terms "first" and/or "second" are used to describe various components, but such components are not limited by these terms. The terms are used to discriminate one component from another component.

FIG. 1 is a diagram illustrating an image display system according to various embodiments of the present disclosure.

Referring to FIG. 1, the image display system 10 may include an image display device 100 and/or a remote control device 200.

The image display device 100 may be a device that processes and outputs images. The image display device 100 is not particularly limited as long as it can output a screen corresponding to image signals, such as a TV, a laptop computer, or a monitor.

The image display device 100 may receive a broadcast signal, process the received broadcast signal, and output a processed broadcast image. When the image display device 100 receives a broadcast signal, the image display device 100 may correspond to a broadcast reception device.

The image display device 100 may receive broadcast signals wirelessly through an antenna, or may receive broadcast signals through a cable. For example, the image display device 100 may receive terrestrial broadcast signals, satellite broadcast signals, cable broadcast signals, and Internet protocol television (IPTV) broadcast signals.

The remote control device 200 may be connected to the image display device 100 by wire and/or wirelessly and provide various control signals to the image display device 100. The remote control device 200 may include devices that establish a wired or wireless network with respect to the image display device 100 and transmit various control signals to the image display device 100 or receive signals related to various operations processed in the image display device 100 from the image display device 100 through the established network.

For example, various input devices such as a mouse, a keyboard, a spatial remote controller, a trackball, and a joystick may be used as the remote control device 200. The remote control device 200 may be referred to as an external device. Hereinafter, "external device" and "remote control device" may be used interchangeably as needed.

The image display device 100 may be connected to only a single remote control device 200 or simultaneously connected to two or more remote control devices 200 to change objects displayed on a screen or adjust a screen state based on the control signal provided from each remote control device 200.

The image display system 10 may further include at least one server 400. The image display device 100 may transmit/receive data to/from the server 400. For example, the image display device 100 may transmit/receive data to/from the server 400 via a network such as the Internet.

The image display device 100 may transmit data related to an operation performed in response to user input to the server 400, and the server 400 may store the data received from the image display device 100.

Figure 2:
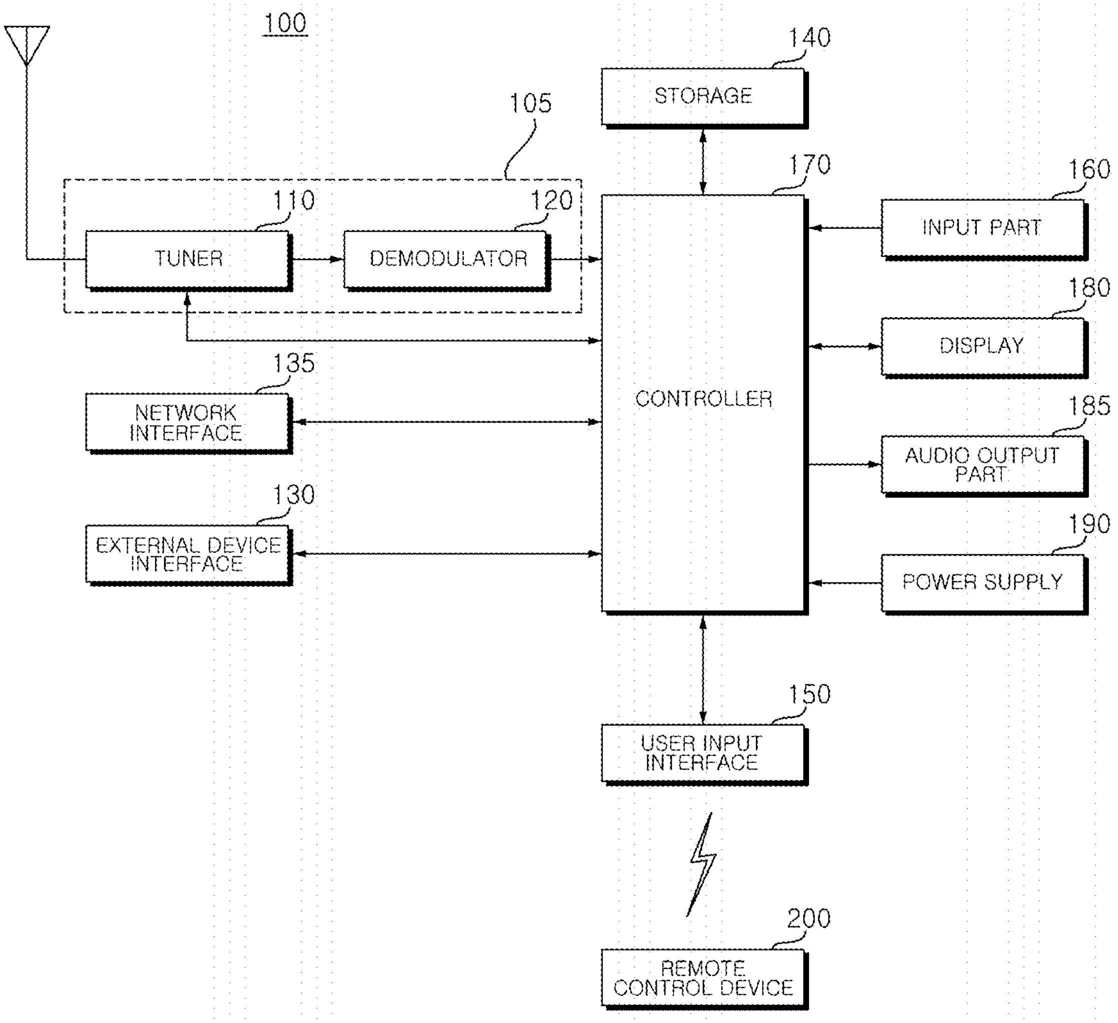
FIG. 2 is an internal block diagram of an image display device illustrated in FIG. 1.

FIG. 2 is an internal block diagram of the image display device illustrated in FIG. 1.

Referring to FIG. 2, the image display device 100 may include a broadcast receiver 105, an external device interface 130, a network interface 135, a storage 140, a user input interface 150, an input part 60, a controller 170, a display 180, an audio output part 185, and/or a power supply 190.

The broadcast receiver 105 may include a tuner 110 and a demodulator 120.

Meanwhile, the image display device 100 may include only the broadcast receiver 105 and the external device interface 130 among the broadcast receiver 105, the external device interface 130, and the network interface 135. That is, the image display device 100 may not include the network interface 135.

The tuner 110 may select a broadcast signal corresponding to a channel selected by a user or broadcast signals of all previously stored channels among broadcast signals received through an antenna (not shown) or a cable (not shown). The tuner 110 may convert the selected broadcast signals into intermediate frequency signals or baseband video or audio signals.

For example, if a selected broadcast signal is a digital broadcast signal, the tuner 110 may convert the selected broadcast signal into a digital IF signal (DIF), and if the selected broadcast signal is an analog broadcast signal, convert the same into an analog baseband video or audio signal (CVBS/SIF). That is, the tuner 110 can process digital broadcast signals or analog broadcast signals. The analog base band video or audio signal (CVBS/SIF) output from the tuner 110 may be directly input to the controller 170.

Meanwhile, the tuner 110 may sequentially select broadcast signals of all of stored broadcast channels through a channel memory function among received broadcast signals and convert the same into intermediate frequency signals or baseband video or audio signals.

The tuner 110 may include a plurality of tuners in order to receive broadcast signals of a plurality of channels. Alternatively, a single tuner that simultaneously receives broadcast signals of a plurality of channels may also be adopted.

The demodulator 120 may receive a digital IF signal (DIF) converted by the tuner 110 and perform a demodulation operation.

The demodulator 120 may output a stream signal TS after performing demodulation and channel decoding. Here, the stream signal may be a multiplexed video signal, audio signal, or data signal.

The stream signal output from the demodulator 120 may be input to the controller 170. After performing demultiplexing and video/audio signal processing, the controller 170 may output video through the display 180 and output audio through the audio output part 185.

The external device interface 130 may transmit/receive data to/from a connected external device. To this end, the external device interface 130 may include an A/V input/output part (not shown).

The external device interface 130 may be connected to external devices such as a digital versatile disc (DVD) player, a Blu-ray player, a game console, a camera, a camcorder, a computer (laptop), a set-top box, and the like in wired/wireless manners, and may also perform input/output operations with respect to external devices.

In addition, the external device interface 130 may establish a communication network with respect to various remote control devices 200 as illustrated in FIG. 1 to receive control signals related to the operation of the image display device 100 from the remote control devices 200 or to transmit data related to the operation of the image display device 100 to the remote control devices 200.

The A/V input/output part may receive video and audio signals from an external device. For example, the A/V input/output part may include an Ethernet terminal, a USB terminal, a composite video banking Sync (CVBS) terminal, a component terminal, an S-video terminal (analog), a digital visual interface (DVI) terminal, a high definition multimedia interface (HDMI) terminal, a mobile high-definition link (MHL) terminal, an RGB terminal, a D-SUB terminal, an IEEE 1394 terminal, an SPDIF terminal, a liquid HD terminal, and the like. Digital signals input through these terminals may be transmitted to the controller 170. Here, analog signals input through the CVBS terminal and the S-video terminal may be converted into digital signals through an analog-to-digital converter (not shown) and transmitted to the controller 170.

The external device interface 130 may include a wireless communication part (not shown) for short-distance wireless communication with other electronic devices. The external device interface 130 may exchange data with a neighboring mobile terminal through the wireless communication part. For example, the external device interface 130 may receive device information, executing application information, application images, and the like from the mobile terminal in a mirroring mode.

The external device interface 130 may perform short-range wireless communication using Bluetooth, radio frequency identification (RFID), infrared data association (IrDA), ultra-wideband (UWB), ZigBee, and the like.

The network interface 135 may provide an interface for connecting the image display device 100 to a wired/wireless network including the Internet.

The network interface 135 may include a communication module (not shown) for connection to a wired/wireless network. For example, the network interface 135 may include a communication module for a wireless LAN (WLAN) (Wi-Fi), wireless broadband (WiBro), world interoperability for microwave access (WiMax), and high speed downlink packet access (HSDPA).

The network interface 135 may transmit/receive data to/from other users or other electronic devices through a connected network or another network linked to the connected network.

The network interface 135 may receive web content or data provided by content providers or network operators. That is, the network interface 135 may receive web content such as movies, advertisements, games, VOD, and broadcast signals and information related thereto provided from content providers or network providers through networks.

The network interface 135 may receive firmware update information and update files provided by network operators, and may transmit data to the Internet, content providers, or network operators.

The network interface 135 may select and receive a desired application from among applications open to the public through a network.

The storage 140 may store programs for processing and controlling each signal in the controller 170 and may store processed video, audio, or data signals. For example, the storage 140 may store application programs designed for the purpose of performing various tasks that can be processed by the controller 170 and selectively provide some of the stored application programs at the request of the controller 170.

Programs stored in the storage 140 are not particularly limited as long as they can be executed by the controller 170.

The storage 140 may execute a function of temporarily storing video, voice, or data signals received from an external device through the external device interface 130.

The storage 140 may store information on a predetermined broadcast channel through a channel memory function such as a channel map.

Although FIG. 2 illustrates an embodiment in which the storage 140 is provided separately from the controller 170, the scope of the present disclosure is not limited thereto, and the storage 140 may be included in the controller 170.

The storage 140 may include at least one of a volatile memory (e.g., a DRAM, an SRAM, an SDRAM, etc.) or a non-volatile memory (e.g., a flash memory, a hard disk drive (HDD), a solid-state drive (SSD), etc.). In various embodiments of the present disclosure, "storage" and "memory" may be used interchangeably.

The user input interface 150 may transmit a signal input by a user to the controller 170 or transmit a signal from the controller 170 to the user.

For example, the user input interface 150 may transmit/receives user input signals such as power on/off, channel selection, and screen settings to/from the remote control device 200, transmit user input signals input through local keys (not shown) such as a power key, a channel key, a volume key, and a setting key to the controller 170, transmit a user input signal input through a sensor (not shown) that senses a user's gesture to the controller 170, or transmit signals from the controller 170 to the sensor.

The input part 160 may be provided on one side of the main body of the image display device 100. For example, the input part 160 may include a touch pad, physical buttons, and the like.

The input part 160 may receive various user commands related to the operation of the image display device 100 and transmit control signals corresponding to the input commands to the controller 170.

The input part 160 may include at least one microphone (not shown) and may receive a user voice through the microphone.

The controller 170 may include at least one processor and may control the overall operation of the image display device 100 using the processor included therein. Here, the processor may be a general processor such as a central processing unit (CPU). The processor may be a dedicated device such as an ASIC or another hardware-based processor.

The controller 170 may demultiplex streams input through the tuner 110, the demodulator 120, the external device interface 130, or the network interface 135, or process demultiplexed signals to generate and output signals for video or audio output.

The display 180 may convert a video signal, a data signal, an OSD signal, and a control signal processed by the controller 170 or a video signal, a data signal, and a control signal received from the external device interface 130 to generate driving signals.

The display 180 may include a display panel (not shown) having a plurality of pixels.

The plurality of pixels provided in the display panel may include RGB subpixels. Alternatively, the plurality of pixels provided in the display panel may include RGBW subpixels. The display 180 may convert a video signal, a data signal, an OSD signal, a control signal, etc. processed by the controller 170 to generate driving signals for the plurality of pixels.

The display 180 may be a plasma display panel (PDP), a liquid crystal display (LCD), an organic light emitting diode (OLED) display, or a flexible display, and may also be a 3D display. 3D displays 180 may be classified into a glasses-free type and a glasses type.

Meanwhile, the display 180 may be configured as a touch screen and used as an input device in addition to an output device.

The audio output part 185 receives the audio signal processed by the controller 170 and outputs the same as audio.

A video signal processed by the controller 170 may be input to the display 180 and displayed as an image corresponding to the video signal. Additionally, the video signal processed by the controller 170 may be input to an external output device through the external device interface 130.

An audio signal processed by the controller 170 may be output as sound to the audio output part 185. Additionally, the audio signal processed by the controller 170 may be input to an external output device through the external device interface 130.

Although not illustrated in FIG. 2, the controller 170 may include a demultiplexer, an image processor, etc. This will be described later with reference to FIG. 3.

In addition, the controller 170 may control overall operations of the image display device 100. For example, the controller 170 may control the tuner 110 to select (tune) a broadcast corresponding to a channel selected by the user or a previously stored channel.

Additionally, the controller 170 may control the image display device 100 using a user command input through the user input interface 150 or an internal program.

Meanwhile, the controller 170 may control the display 180 to display an image. Here, the image displayed on the display 180 may be a still image or a video, and may be a 2D image or a 3D image.

Further, the controller 170 may cause a predetermined 2D object to be displayed in an image displayed on the display 180. For example, the object may be at least one of a connected web screen (newspaper, magazine, or the like), an electronic program guide (EPG), various menus, widgets, icons, a still image, a video, or text.

Meanwhile, the image display device 100 may further include an imaging device (not shown). The imaging device may capture an image of the user. The imaging device may be implemented as a single camera, but the present disclosure is not limited thereto and the imaging device may also be implemented as a plurality of cameras. Meanwhile, the imaging device may be embedded in the image display device 100 at the top of the display 180 or may be disposed separately. Image information captured by the imaging device may be input to the controller 170.

The controller 170 may recognize a location of the user based on images captured by the imaging device. For example, the controller 170 may ascertain the distance (z-axis coordinate) between the user and the image display device 100. In addition, the controller 170 may ascertain the x-axis coordinate and y-axis coordinate in the display 180 corresponding to the location of the user.

The controller 170 may detect a user's gesture based on images captured by the imaging device, each signal detected by a sensor, or a combination thereof.

The power supply 190 may supply corresponding power throughout the image display device 100. In particular, the power supply 190 may supply power to the controller 170, which can be implemented in the form of a system on chip (SOC), the display 180 for displaying images, and the audio output part 185 for audio output.

Specifically, the power supply 190 may include a converter (not shown) that converts AC power to DC power and a DC/DC converter (not shown) that converts a DC power level.

The remote control device 200 may transmit user input to the user input interface 150. To this end, the remote control device 200 may use Bluetooth, radio frequency (RF) communication, infrared communication, ultra-wideband (UWB), ZigBee, and the like. Additionally, the remote control device 200 may receive video, audio, or data signals output from the user input interface 150 and display the same or output the same as audio through the remote control device 200.

The image display device 100 described above may be a stationary or mobile digital broadcast receiver capable of receiving digital broadcasting.

Meanwhile, the block diagram of the image display device 100 shown in FIG. 2 is merely a block diagram for an embodiment of the present disclosure, and components of the block diagram may be integrated, added, or omitted according to the specifications of the image display device 100 that is actually implemented.

Figure 3:
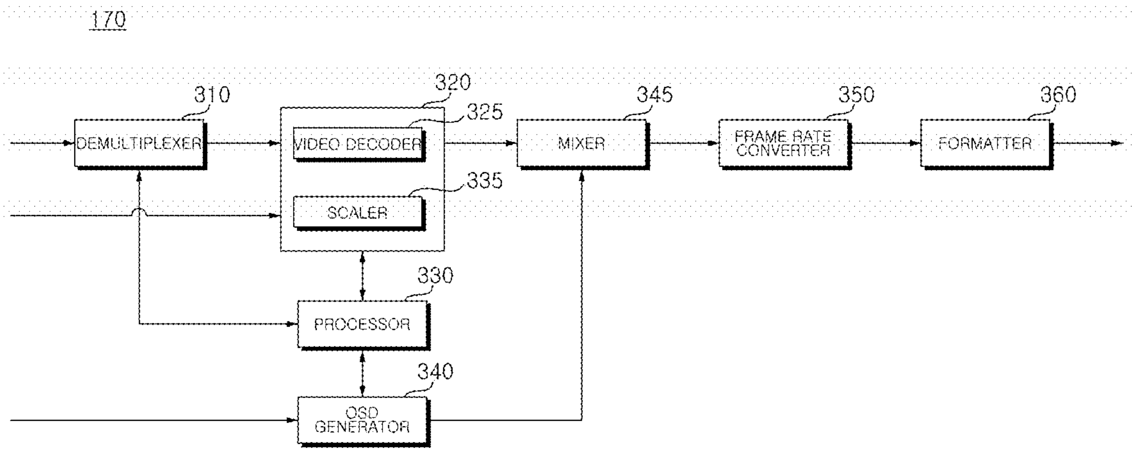
FIG. 3 is an internal block diagram of a controller illustrated in FIG. 2.

That is, two or more components may be combined into one component, or one component may be subdivided into two or more components as necessary. In addition, the function executed by each block is for describing an embodiment of the present disclosure, and the specific operation or device does not limit the scope of the present disclosure. FIG. 3 is an internal block diagram of the controller illustrated in FIG. 2.

Referring to FIG. 3, the controller 170 according to an embodiment of the present disclosure may include a demultiplexer 310, an image processor 320, a processor 330, an OSD generator 340, a mixer 345, a frame rate converter 350, and/or a formatter 360. In addition, the controller 170 may further include an audio processor (not shown) and a data processor (not shown).

The demultiplexer 310 may demultiplex an input stream. For example, when an MPEG-2 TS is input, the demultiplexer 310 may demultiplex the input MPEG-2 TS to separate the same into video, audio, and data signals. Here, the stream signal input to the demultiplexer 310 may be a stream signal output from the tuner 110, the demodulator 120, or the external device interface 130.

The image processor 320 may perform image processing on demultiplexed video signals. To this end, the image processor 320 may include a video decoder 325 and a scaler 335.

The video decoder 325 may decode a demultiplexed video signal, and the scaler 335 may perform scaling such that the resolution of a decoded video signal can be output through the display 180.

The video decoder 325 may include decoders of various standards. For example, the video decoder 25 may include an MPEG-2 decoder, an H.264 decoder, a 3D image decoder for color images and depth images, a decoder for multiple viewpoint images, etc.

The processor 330 may control overall operations within the image display device 100 or the controller 170. For example, the processor 330 may control the tuner 110 to select (tune to) a broadcast related to a channel selected by a user or a pre-stored channel.

In addition, the processor 330 may control the image display device 100 by a user command input through the user input interface 150 or an internal program.

Additionally, the processor 330 may perform data transmission control with respect to the network interface 135 or the external device interface 130.

Additionally, the processor 330 may control the operations of the demultiplexer 310, the image processor 320, and the OSD generator 340 in the controller 170.

The OSD generator 340 may generate an OSD signal according to user input or by itself. For example, the OSD generator 340 may generate a signal for displaying various types of information as graphics or text on the screen of the display 180 based on a user input signal input through the input part 160.

The generated OSD signal may include various types of data such as a user interface screen, various menu screens, widgets, and icons of the image display device 100. Additionally, the generated OSD signal may include 2D objects or 3D objects.

Additionally, the OSD generator 340 may generate a pointer that can be displayed on the display 180 based on a pointing signal input from the remote control device 200.

The OSD generator 340 may include a pointing signal processor (not shown) that generates a pointer. The pointing signal processor (not shown) may be provided separately rather than being included in the OSD generator 240.

The mixer 345 may mix the OSD signal generated by the OSD generator 340 and a decoded video signal processed by the image processor 320. The mixed video signal may be provided to the frame rate converter 350.

The frame rate converter (FRC) 350 may convert the frame rate of input video. Meanwhile, the frame rate converter 350 may also output the input video as it is without separate frame rate conversion.

The formatter 360 may arrange left-eye image frames and right-eye image frames of a frame-rate-converted 3D image. Additionally, the formatter 360 may output a synchronization signal Vsync for opening a left eye glass and a right eye glass of a 3D viewing device (not shown).

Further, the formatter 360 may change the format of an input video signal into a video signal for display on the display 180 and output the video signal.

Additionally, the formatter 360 may change the format of a 3D video signal. For example, the formatter 360 may change the format to any one of various 3D formats such as side-by-side format, top/down format, frame sequential format, interlaced format, and checker box format.

Meanwhile, the formatter 360 may convert a 2D video signal into a 3D video signal. For example, the formatter 360 may detect an edge or a selectable object within a 2D video signal, and separate an object related to the detected edge or the selectable object to generate a 3D video signal according to a 3D image generation algorithm. Here, the generated 3D video signal may be separated and arranged into a left-eye video signal (L) and a right-eye video signal (R), as described above.

Although not illustrated, a 3D processor (not shown) for 3-dimensional effect signal processing may be additionally disposed after the formatter 360. Such a 3D processor may process brightness, tint, and color adjustment of video signals to improve 3D effects. For example, the 3D processor may perform signal processing for making near areas clear and making far areas blurry. The functions of the 3D processor may be merged into the formatter 360 or the image processor 320.

The audio processor (not shown) within the controller 170 may perform audio processing on a demultiplexed audio signal. To this end, the audio processor (not shown) may include various decoders.

Additionally, the audio processor (not shown) within the controller 170 may process bass, treble, and volume control.

The data processor (not shown) within the controller 170 may perform data processing on a demultiplexed data signal. For example, if the demultiplexed data signal is an encoded data signal, the data processor can decode the demultiplexed data signal. The encoded data signal may be electronic program guide (EPG) information including broadcast information such as the start time and end time of a broadcast program aired on each channel.

Meanwhile, the block diagram of the controller 170 shown in FIG. 3 is merely a block diagram for one embodiment of the present disclosure, and components of the block diagram may be integrated, added, or omitted according to the specifications of the controller 170 that is actually implemented.

In particular, the frame rate converter 350 and the formatter 360 may be provided separately without being provided within the controller 170, or may be provided separately as a single module.

Figure 4:
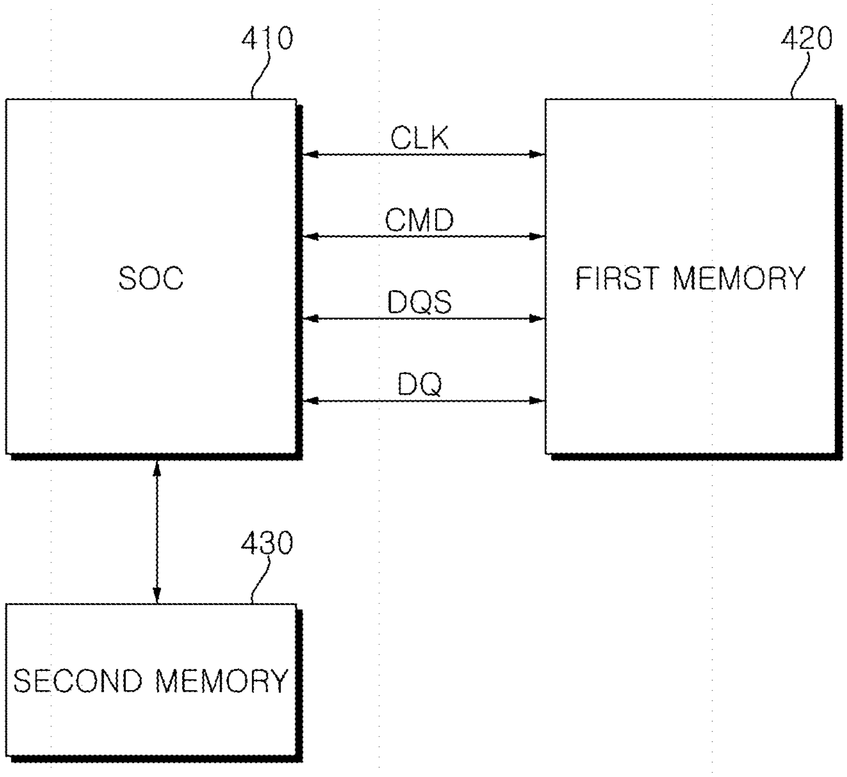
FIG. 4 is an internal block diagram of an image display device according to an embodiment of the present disclosure.

FIG. 4 is an internal block diagram of the image display device according to an embodiment of the present disclosure.

Referring to FIG. 4, the image display device 100 may include a memory controller 410, a first memory 420, and/or a second memory 430.

The memory controller 410 may write data to the first memory 420 and/or the second memory 430. The memory controller 410 may read data stored in the first memory 420 and/or the second memory 430. The memory controller 410 may be called a host. The memory controller 410 may be included in the controller 170.

The memory controller 410 may transmit a clock signal CLK, a command signal CMD, a data strobe signal DQS, and/or a data signal DQ to the first memory 420. The memory controller 410 may transmit an address with respect to a location where data is written or read to the first memory 420.

The command signal CMD may include an activation command, a write command, a read command, a precharge command, a no-operation command, and the like. However, the scope of the present disclosure is not limited thereto, and the command signal may include various types of commands.

The first memory 420 may store data based on a signal transmitted from the memory controller 410. The first memory 420 may provide data based on a signal transmitted from the memory controller 410. The first memory 420 may include a dynamic random access memory (DRAM). However, the scope of the present disclosure is not limited thereto, and the first memory 420 may include at least one of various semiconductor memories. Hereinafter, an example in which the memory controller 410 and the first memory 420 communicate with each other based on a double data rate (DDR) interface will be described.

The second memory 430 may store data based on a signal transmitted from the memory controller 410. The second memory 430 may provide data based on a signal transmitted from the memory controller 410. Although the second memory 430 is described as including an embedded multimedia controller (eMMC) in the present disclosure, the present disclosure is not limited thereto.

The memory controller 410, the first memory 420, and/or the second memory 430 may be disposed on one main board.

Figure 5:
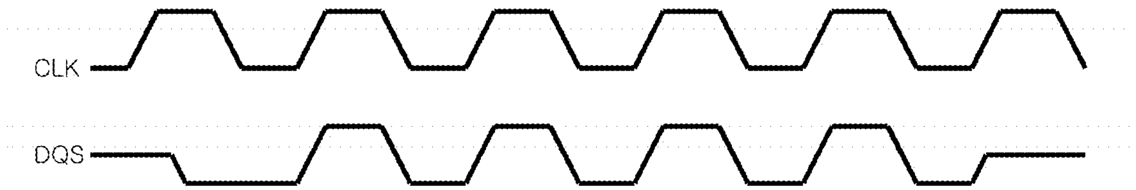
FIG. 5 to FIG. 7 are timing diagrams of a clock signal, a command signal, a data strobe signal, and/or a data signal input to a memory according to an embodiment of the present disclosure.

Referring to FIG. 5, the clock signal CLK and the data strobe signal DQS may be toggle signals with repeated transition between a low level and a high level. The clock signal CLK and the data strobe signal DQS may be input to the first memory 420.

Figure 6:
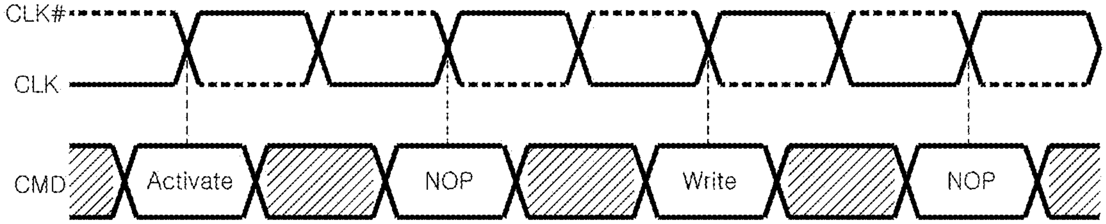

Referring to FIG. 6, the first memory 420 may use a positive clock signal CLK and/or a negative clock signal CLK #corresponding to a clock signal received from the memory controller 410. Hereinafter, description will be based on the positive clock CLK.

The first memory 420 may identify a command CMD based on the positive clock signal CLK. For example, the first memory 420 may identify the command CMD at rising edges of the positive clock signal CLK. The first memory 420 may perform an operation related to the identified command.

Figure 7:
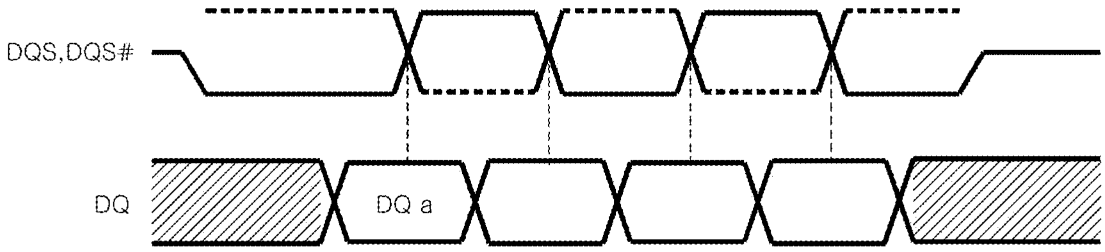

Referring to FIG. 7, the first memory 420 may use a positive data strobe signal DQS and/or a negative data strobe signal DQS #corresponding to the data strobe signal DQS received from the memory controller 410. Hereinafter, description will be based on the positive data strobe signal DQS.

The first memory 420 may identify data DQ based on the positive data strobe signal DQS. For example, the first memory 420 may identify the data DQ at rising edges of the positive data strobe signal DQS.

Figure 8:
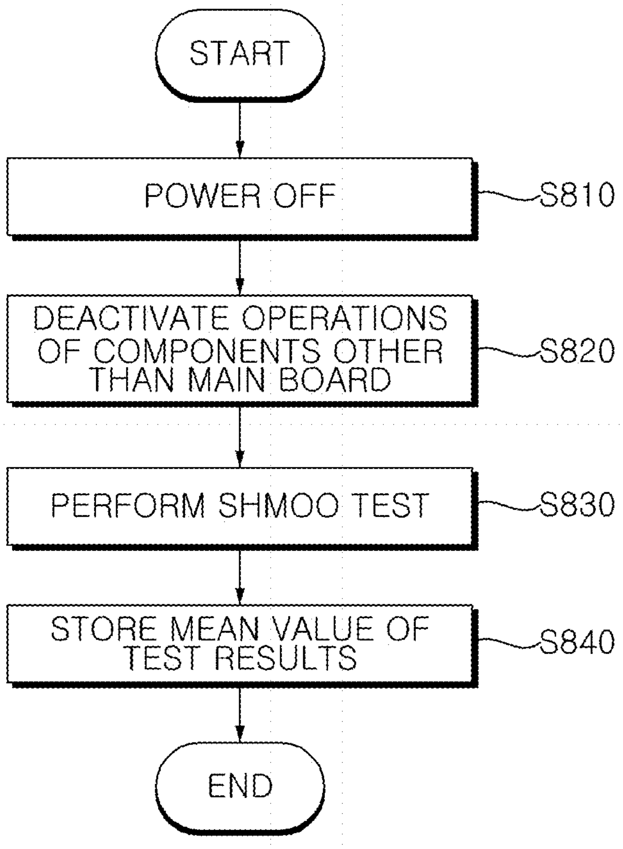
FIG. 8 is a flowchart of a method of operating an image display device according to an embodiment of the present disclosure.

FIG. 8 is a flowchart of a method of operating the image display device according to an embodiment of the present disclosure.

Referring to FIG. 8, the image display device 100 may turn off the power in operation S810. For example, the image display device 100 may turn off the power upon receiving a user input of pressing a power key included in the input part 160 or upon receiving a power-off signal from the remote control device 200 while the power is on.

The image display device 100 may deactivate the operations of components other than the main board in operation S820. The image display device 100 may block the supply of power to the components other than the main board. For example, the image display device 100 may block the supply of power to a communication module included in the network interface 135, the display 180, and the like. As the main board remains activated, the operations of the memory controller 410, the first memory 420, and/or the second memory 430 may be maintained.

The image display device 100 may perform a Shmoo test in response to power off in operation S830. Here, the Shmoo test is a process of determining the success or failure of writing or reading data under conditions by writing or reading data to or from the first memory 420 while changing the conditions. Hereinafter, the Shmoo test performed on the data strobe signal DQS and the data signal DQ will be described. However, the present disclosure is not limited thereto, and the Shmoo test may be performed on the clock signal CLK and the command signal CMD in the same or similar manner. Meanwhile, in the present disclosure, description is based on rising edges of the data strobe signal DQS, but the present disclosure is not limited thereto.

Figure 9:
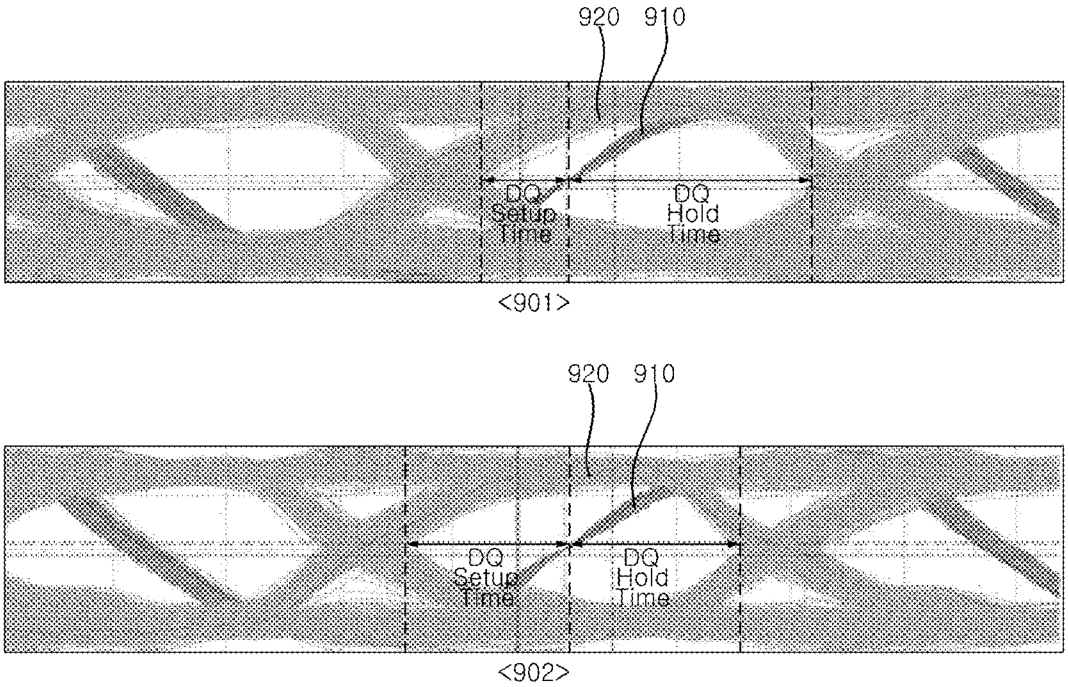
FIG. 9 is a diagram referenced in description of the operation of the image display device according to an embodiment of the present disclosure.

Referring to FIG. 9, in an ideal case 901, the center of a rising edge of the data strobe signal DQS 910 may be controlled to be located at the center of a window of the data signal DQ 920. At this time, a setup time and a hold time can be secured. Here, the setup time may be a time interval between the starting point of a window of the data signal DQ and the center of a rising edge of the data strobe signal DQS. The hold time may be a time interval between the center of the rising edge of the strobe signal DQS and the end point of the window of the data signal DQ. That is, if the data signal DQ is in a stable state before data is identified, and the data signal DQ maintains a stable state at a certain level even after the data is identified, the data included in the data signal DQ can be accurately identified.

Meanwhile, when the center of a rising edge of the data strobe signal DQS 910 deviates from the center of the window of the data signal DQ 920 (902), the setup time or the hold time may decrease. At this time, the data included in the data signal DQ may not be identified, or the data may be incorrectly identified.

According to an embodiment, the image display device 100 may determine whether writing or reading of data to or from the first memory 420 is successful by changing the centers of the rising edges of the data strobe signal DQS for each piece of data included in the data signal DQ. The data bits of the data included in the data signal DQ may be 8 bits.

The memory controller 410 may move the center of a rising edge of the data strobe signal DQS by a predetermined time (e.g., 10 ps). The memory controller 410 may move the center of a rising edge of the data strobe signal DQS from a preset point. For example, the preset point may be a point where a window of predetermined data of the data signal DQ starts. The memory controller 410 may determine the minimum and maximum values of the numbers of times the center of a rising edges of the data strobe signal DQS is moved (hereinafter referred to as movement counts) for successfully written or read data. The memory controller 410 may calculate the number of times the center of a rising edge of the data strobe signal DQS is located at the center of a window of predetermined data of the data signal DQ (hereinafter, a centering count) based on the determined minimum and maximum values. The centering count may be a representative value for the minimum and maximum values. For example, if the minimum and maximum values of the movement counts are 105 and 147, the centering count may be calculated as 126 which is the median value. That is, when the center of a rising edge of the data strobe signal DQS is moved by 1.26 ns from a preset point, the center of the rising edge of the data strobe signal DQS can be located at the center of a window of predetermined data of the data signal DQ.

The image display device 100 may store the mean value of results of performing the Shmoo test in the second memory 430 in operation S840. For example, the memory controller 410 may perform an operation of calculating a centering count for each piece of data included in the data signal DQ a predetermined number of times (e.g., 100 times). Here, the memory controller 410 may calculate the mean value of centering counts for each piece of data included in the data signal DQ. The memory controller 410 may store the mean value calculated for each piece of data included in the data signal DQ in the second memory 430.

The memory controller 410 of the image display device 100 may output the data strobe signal DQS to the first memory 420 based on data stored in the second memory 430 based on the image display device 100 being turned on. That is, considering that it takes a considerable amount of time to perform the Shmoo test to calculate the mean value of centering counts, the Shmoo test may be performed based on the image display device 100 being turned off, and the results of the Shmoo test performed immediately before may be used based on the image display device 100 being turned on.

According to an embodiment, the image display device 100 may perform the Shmoo test in a predetermined period. For example, the memory controller 410 may determine whether the predetermined period has elapsed based on power being turned off. At this time, the memory controller 410 may update the data stored in the second memory 430 based on the elapse of the predetermined period. Here, the predetermined period may be set to quarterly, semi-annually, or annually, but the present disclosure is not limited thereto.

Meanwhile, the image display device 100 may perform the Shmoo test based on the external power being supplied again after the external power supply has been stopped. That is, if the supply of external power is interrupted before the predetermined period elapses, the Shmoo test may be performed in consideration of the possibility of the environment in which the image display device 100 is used being changed. For example, the image display device 100 may update the data stored in the second memory 430 based on the power being turned off in a state in which the external power is supplied again and the image display device 100 is turned on.

As described above, according to various embodiments of the present disclosure, it is possible to secure a timing margin while minimizing deterioration of usability.

Referring to FIG. 1 to FIG. 9, the image display device 100 according to an embodiment of the present disclosure includes the memory controller 410 configured to output a first signal and a toggling second signal, the first memory 420 configured to process the first signal based on the second signal, and the second memory 430, wherein the memory controller 410 performs a Shmoo test on the second signal based on the image display device 100 being turned off, stores data on results of performing the Shmoo test in the second memory 430, and outputs the second signal based on data stored in the second memory 420 based on the image display device being turned on.

Further, according to an embodiment of the present disclosure, the memory controller 410 may move a center of an edge of the second signal by a predetermined time from a preset point, determine numbers of times the center of the edge of the second signal is moved at which processing of the first signal is successful, and calculate a result value of a number of movements causing the center of the edge of the second signal to be located at a center of a window of the first signal based on a minimum value and a maximum value of the numbers of movements.

Further, according to an embodiment of the present disclosure, the result value of the number of movements may be a median value between the minimum value and the maximum value.

Further, according to an embodiment of the present disclosure, the memory controller may perform the Shmoo test a plurality of times based on a preset number of tests, and store a mean value of a plurality of result values calculated based on the number of tests in the second memory 430 as data on the result of performing the Shmoo test.

Further, according to an embodiment of the present disclosure, the memory controller 410, the first memory 420, and the second memory 430 may be disposed on a single main board, and based on the image display device 100 being turned off, supply of power to components of the image display device 100 other than the main board may be cut off.

Further, according to an embodiment of the present disclosure, the memory controller 410 may determine whether a predetermined period elapses based on the image display device 100 being turned off, and perform the Shmoo test on the second signal based on the elapse of the predetermined period.

Further, according to an embodiment of the present disclosure, the memory controller 410 may perform the Shmoo test on the second signal regardless of the predetermined period based on external power being supplied again after supply of the external power to the image display device 100 is interrupted.

Further, according to an embodiment of the present disclosure, the second memory 430 may be an embedded multimedia controller (eMMC).

Further, according to an embodiment of the present disclosure, the first signal may be a command signal, and the second signal may be a clock signal.

Further, according to an embodiment of the present disclosure, the first signal may be a data signal, and the second signal may be a data strobe signal.

The attached drawings are only for easy understanding of the embodiments disclosed in this specification, and the technical idea disclosed in this specification is not limited by the attached drawings, and all changes, equivalents, and changes included in the spirit and technical scope of the present disclosure are not limited thereby.

Meanwhile, the operating method of the present disclosure can be implemented as processor-readable code on a processor-readable recording medium. Processor-readable recording media include all types of recording devices that store data that can be read by a processor. Examples of processor-readable recording media include a ROM, a RAM, a CD-ROM, a magnetic tape, a floppy disk, and an optical data storage device, and also include those implemented in the form of a carrier wave, such as transmission through the Internet. Additionally, a processor-readable recording medium is distributed in a computer system connected to a network, and thus processor-readable code can be stored and executed in a distributed manner.

The effects of the image display device according to the present disclosure will be described as follows.

According to at least one embodiment of the present disclosure, it is possible to secure a timing margin while minimizing deterioration of usability.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. An image display device comprising:

a memory controller configured to output a first signal and a toggling second signal;

a first memory configured to process the first signal based on the second signal; and a second memory, wherein the memory controller is configured to:

determine whether a predetermined period has elapsed since a most recently performed Shmoo test based on the image display device being turned off, perform a Shmoo test on the second signal based on an elapse of the predetermined period or based on a predetermined condition, store data resulting from performing the Shmoo test in the second memory, and output the second signal based on the data stored in the second memory based on the image display device being turned on, wherein the predetermined condition corresponds to an external power being supplied again to the image display device after a supply of the external power to the image display device is interrupted.

2. The image display device of claim 1, wherein the memory controller is configured to:

move a center of an edge of the second signal by a predetermined time from a preset point, determine a number of movements of the center of the edge of the second signal at which processing of the first signal is successful, and calculate a result value of the number of movements that cause the center of the edge of the second signal to be located at a center of a window of the first signal based on a minimum value and a maximum value of the number of movements.

3. The image display device of claim 2, wherein the result value of the number of movements is a median value between the minimum value and the maximum value.

4. The image display device of claim 2, wherein the memory controller is configured to:

perform the Shmoo test a plurality of times based on a preset number of tests, and store a mean value of a plurality of result values calculated based on the number of tests in the second memory as the data resulting from performing the Shmoo test.

5. The image display device of claim 1, wherein the memory controller, the first memory, and the second memory are disposed on a single main board, and based on the image display device being turned off, a supply of power to components of the image display device other than the single main board is cut off.

6. The image display device of claim 1, wherein the second memory is an embedded multimedia controller (eMMC).

7. The image display device of claim 1, wherein
the first signal is a command signal, and
the second signal is a clock signal.

8. The image display device of claim 1, wherein
the first signal is a data signal, and
the second signal is a data strobe signal.

9. A method performed by an image display device that includes a memory controller configured to output a first signal and a toggling second signal, a first memory configured to process the first signal based on the second signal, and a second memory, the method comprising:

determining whether a predetermined period has elapsed since a most recently performed Shmoo test based on the image display device being turned off, performing a Shmoo test on the second signal based on an elapse of the predetermined period or based on a predetermined condition, storing data resulting from performing the Shmoo test in the second memory, and outputting the second signal based on the data stored in the second memory based on the image display device being turned on, wherein the predetermined condition corresponds to an external power being supplied again to the image display device after a supply of the external power to the image display device is interrupted.

* * * * *